(12) United States Patent
Takagi et al.

(10) Patent No.: US 6,518,862 B1
(45) Date of Patent: Feb. 11, 2003

(54) MAGNETOSTATIC WAVE ELEMENT AND MANUFACTURING METHOD THEREFOR

(75) Inventors: Takashi Takagi, Omihachiman (JP); Masaru Fujino, Ostu (JP)

(73) Assignee: Murata Manufacturing Co. Ltd. (JP)

( * ) Notice: Subject to any disclaimer, the term of this patent is extended or adjusted under 35 U.S.C. 154(b) by 0 days.

(21) Appl. No.: 09/724,448

(22) Filed: Nov. 28, 2000

(30) Foreign Application Priority Data

Dec. 9, 1999 (JP) .......................................... 11-350305

(51) Int. Cl.⁷ ................................................ H01F 1/20
(52) U.S. Cl. ........................................ 333/202; 428/692
(58) Field of Search ........................... 333/202; 428/692

(56) References Cited

U.S. PATENT DOCUMENTS

| 4,138,651 A | | 2/1979 | Bongianni | |
|---|---|---|---|---|
| 5,701,108 A | * | 12/1997 | Fujii et al. | ................... 333/202 |
| 5,871,856 A | * | 2/1999 | Kumatoriya et al. | ......... 428/700 |
| 6,426,156 B2 | * | 7/2002 | Fujino | ..................... 252/62.56 |

FOREIGN PATENT DOCUMENTS

| EP | 0 606 867 A1 | 7/1994 | | |
|---|---|---|---|---|
| EP | 0 737 987 A1 | 10/1996 | | |
| JP | 361215297 A | * | 9/1986 | ........... C30B/29/28 |

OTHER PUBLICATIONS

"Growth of Expitaxial Films of Paramagnetic Garnets and Their Characterization by CEMS and Double–Crystal Diffractometry"; G. Balestrino, et al.; *Journal of Crystal Growth*; 85 (1987) 270–274; North–Holland, Amsterdam, Nov. 1, 1987.

"A Novel Non–Pb System for the Preparation of Yttrium and Rare Earth Iron Gallium and Aluminum Garnets"; W.A. Bonner; *Mat. Res. Bull.*; vol. 12, pp. 289–298; 1977; Pergamon Press, Inc., Jan.

"LPE Growth of Double Layer Structures from Molybdate and Lead Borate Fluxes"; R. Korenstein, et al.; *J. App. Phys.*; 50(11), Nov. 1979; pp. 7830–7831/.

* cited by examiner

Primary Examiner—Robert Pascal
Assistant Examiner—Joseph Chang
(74) Attorney, Agent, or Firm—Dickstein, Shapiro, Morin & Oshinsky, LLP.

(57) ABSTRACT

A magnetostatic wave element, having a narrow bandwidth range Ba in which an output signal is suppressed centering around frequency $f_o$ by 3 dB or more for an input signal with an electric power of Psh or less at a frequency $f_o$, is obtained using substantially Pb-free materials.

22 Claims, 3 Drawing Sheets

MAGNETOSTATIC WAVE ELEMENT AND MANUFACTURING METHOD THEREFOR

BACKGROUND OF THE INVENTION

1. Field of the Invention

The present invention relates to a magnetostatic wave element. More specifically, it relates to a magnetostatic wave element which, for example, converts microwaves into magnetostatic waves which propagate through a single crystal magnetic garnet film and further converts the magnetostatic waves into microwaves for output, as well as to a manufacturing method therefor.

2. Description of the Related Art

FIG. 1 is an illustrative view showing an example of a magnetostatic wave element which is art related to the present invention. A magnetostatic wave element 10 contains a non-magnetic substrate 12. A gadolinium-gallium-garnet (GGG) substrate or the like is used as the non-magnetic substrate 12, for example. A single crystal magnetic garnet film 14 is formed on the non-magnetic substrate 12. An yttrium-iron-garnet (YIG) film or the like is used as the single crystal magnetic garnet film 14. Furthermore, two microstrip lines 16 and 18 are formed on the single crystal magnetic garnet film 14 at a specific distance apart. Microstrip line 16 is used for signal input and microstrip line 18 is used for signal output.

When such an magnetostatic wave element 10 is used, a magnetic field H is applied, for example, in the direction parallel to the microstrip lines 16 and 18. Accordingly, when a microwave signal is input at one of the microstrip lines such as microstrip line 16, it is converted to a magnetostatic wave and the magnetostatic wave propagates through the single crystal magnetic garnet film 14. Then it is converted to microwaves at the other microstrip line 18 and is output as a microwave output signal.

With such a magnetostatic wave element, when an input signal with an electric power Pin which is not less than Psh is input at a frequency $f_o$, a signal with an electric power which is smaller than that of the input signal by the value of Pin-Psh is output only for the region of frequency $f_o$ as shown in FIGS. 2A and 2B. An S/N enhancer, a limiter, etc., may be manufactured utilizing this behavior.

Thus, this magnetostatic wave element provides an output signal with an electric power smaller than that of the input signal at frequency $f_o$. There is also observed a phenomenon in which an output signal is suppressed for an input signal with an electric power smaller than Psh in a frequency region which is smaller or larger than $f_o$. Although an output signal is preferably not suppressed for an input signal with an electric power not more than Psh in practice, there is such a phenomenon in reality, degrading the properties of a magnetostatic wave element.

In general, a magnetostatic wave element which has good properties has desirably a narrow bandwidth range in which an output signal is suppressed for an input signal with an electric power not more than Psh. That is, a magnetostatic wave element with a narrow bandwidth range Ba is preferable, when a bandwidth range in which an output signal is suppressed centering around frequency $f_o$ by 3 dB or more, is represented by Ba as shown in FIGS. 2A and 2B.

SUMMARY OF THE INVENTION

Accordingly, it is an object of the present invention to provide a magnetostatic wave element having a narrow bandwidth range Ba in which an output signal is suppressed centering around frequency $f_o$ by 3 dB or more for an input signal with an electric power not more than Psh, as well as to provide a manufacturing method therefor.

Various aspects of the present invention are described as follows.

(1) According to the present invention, a magnetostatic wave element comprising a single crystal magnetic garnet film is manufactured, wherein the film contains about 5 ppm or less by weight of Pb.

(2) In such a magnetostatic wave element, the single crystal magnetic garnet film can be formed on a non-magnetic substrate by the liquid phase epitaxial method.

(3) Furthermore, the single crystal magnetic garnet film can be formed by the liquid phase epitaxial method using a raw material comprising $MoO_3$.

(4) Furthermore, the single crystal magnetic garnet film can be an yttrium-iron-garnet-based single crystal film.

(5) Furthermore, the single crystal magnetic garnet film can comprise two microstrip lines located on the film and approximately in parallel with each other with a specific distance therebetween.

(6) According to the present invention, such an element is manufactured by a method for manufacturing a magnetostatic wave element having a single crystal magnetic garnet film, comprising the steps of:

preparing a raw material by melting into a solvent having a molybdenum oxide as the principal component and being substantially Pb-free, a single crystal film forming component for forming the single crystal magnetic garnet film; and bringing this raw material into contact with a seed substrate to grow a single crystal magnetic garnet film with a Pb content of about 5 ppm or less by weight on the seed substrate.

(7) According to the present invention, such an element is also manufactured by a method for manufacturing a magnetostatic wave element as set forth in the above-described (6), wherein the molybdenum oxide is $MoO_3$.

(8) According to the present invention, such an element is also manufactured by a method for manufacturing a magnetostatic wave element as set forth in the above-described (6), wherein the solvent further comprises an alkali metal oxide.

(9) According to the present invention, such an element is also manufactured by a method for manufacturing a magnetostatic wave element as set forth in the above-described (8), wherein the solvent comprises about 50–90 mol % of the molybdenum oxide, and about 10–50 mol % of the alkali metal oxide.

(10) According to the present invention, such an element is also manufactured by a method for manufacturing a magnetostatic wave element as set forth in the above-described (6), wherein the single crystal film forming component is a component of an yttrium-iron-garnet system.

(11) According to the present invention, such an element is also manufactured by a method for manufacturing a magnetostatic wave element as set forth in the above-described (6), wherein the seed substrate is a non-magnetic substrate.

(12) According to the present invention, such an element is also manufactured by a method for manufacturing a magnetostatic wave element as set forth in the above-described (11), wherein the non-magnetic substrate is a substrate made of a gadolinium-gallium-garnet system.

(13) According to the present invention, such an element is also manufactured by a method for manufacturing a magnetostatic wave element as set forth in the above-described (6), wherein two microstrip lines are formed on the single crystal magnetic garnet film and approximately in parallel with each other at a specific distance therebetween.

A single crystal magnetic garnet film formed on a non-magnetic substrate by the liquid phase epitaxial method is mainly used for a magnetostatic wave element. To form a single crystal magnetic garnet film on a non-magnetic substrate, a solution of a single crystal film forming component melted as a solute in a solvent component is supersaturated, and the solution is brought into contact with a rotating non-magnetic substrate so as to grow a single crystal on the non-magnetic substrate. According to the most common methods, a Pb compound is used as one of the components for the solvent. Therefore, the single crystal magnetic garnet film thus manufactured comprises Pb which is not an element for constituting the magnetic garnet.

As a result of research to study the relationship between the content of Pb contained in a single crystal magnetic garnet film and the bandwidth range Ba in which an output signal was suppressed centering around frequency $f_o$ by 3 dB or more, it was found that Ba became narrower when there was a lower content of Pb, as shown in FIG. 3. Thereupon, it was supposed that a magnetostatic wave element having good properties could be obtained if the single crystal magnetic garnet film was substantially Pb-free, and the present invention has been achieved accordingly. It is noted that the content of Pb is specified to be about 5 ppm or less by weight, since the limit of detection of the inductively coupled plasma emission spectroscopy is about 5 ppm by weight for measuring the content of Pb contained in a single crystal magnetic garnet film.

The above-described purpose, other purposes, features and advantages of the present invention will be further clarified by the detailed description of the following embodiments of the invention with reference to the drawings.

According to the present invention, the bandwidth range Ba in which the electric power of an output signal is suppressed centering around frequency $f_o$ by 3 dB or more, can be narrowed by virtue of a Pb content of about 5 ppm or less by weight contained in a single crystal magnetic garnet film formed on a non-magnetic substrate. As a result, a magnetostatic wave element having good frequency properties can be obtained. Therefore, it is now possible to use this magnetostatic wave element in manufacturing an S/N enhancer or a limiter with good properties.

DESCRIPTION OF THE PREFERRED EMBODIMENTS

Figure 1:
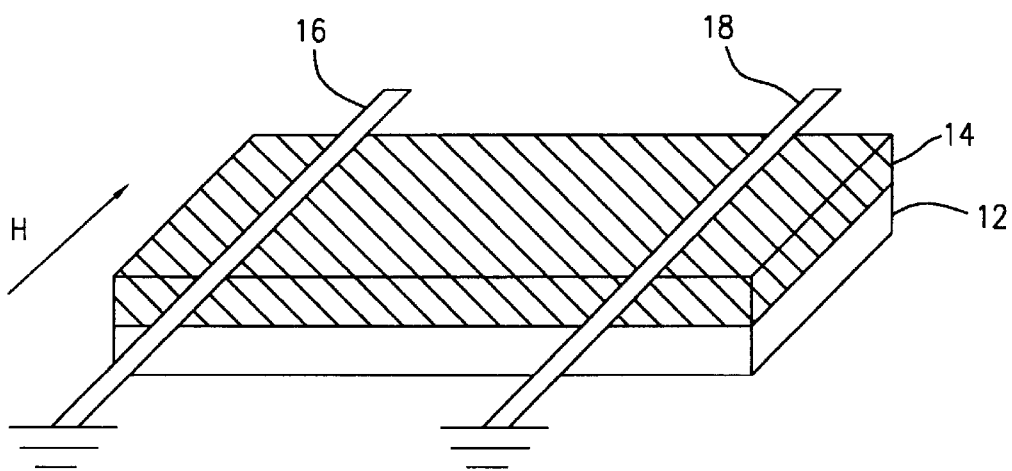
FIG. 1 is an illustrative view showing the structure of a magnetostatic wave element.
Figure 2A:
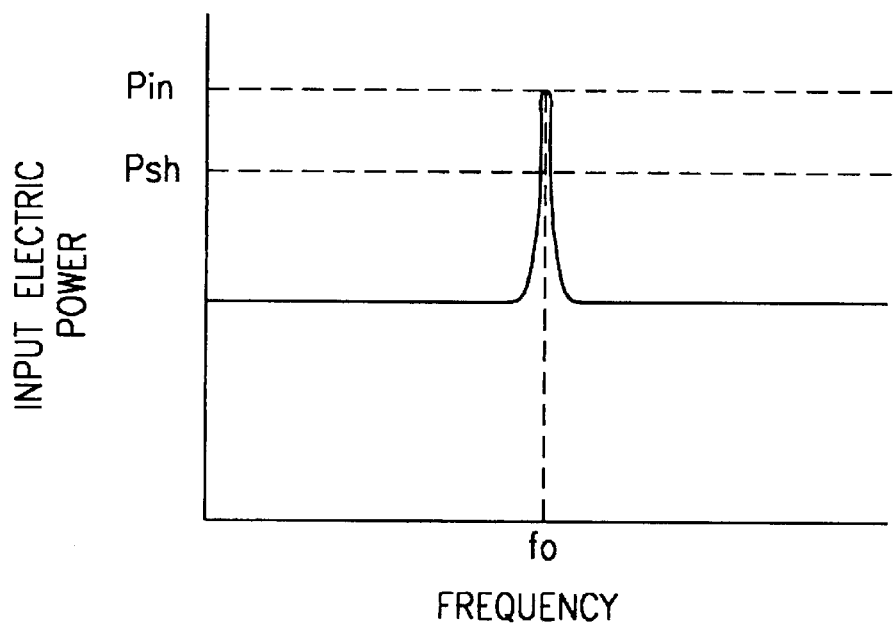
FIGS. 2A and 2B are graphs showing the relationships between input signals and output signals in a conventional magnetostatic wave element having the structure shown in FIG. 1.
Figure 2B:
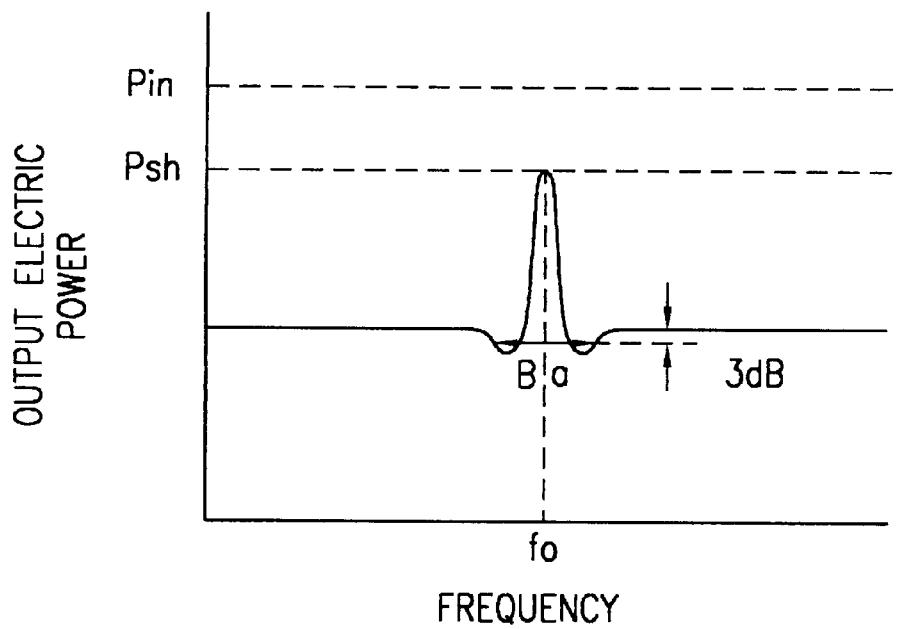

A magnetostatic wave element 10 having a structure shown in FIG. 1 is used according to the present invention.

In the magnetostatic wave element 10 having a structure shown in FIG. 1, a gadolinium-gallium-garnet (GGG) substrate is used as a non-magnetic substrate 12 or a seed substrate, for example, and an yttrium-iron-garnet (YIG) film is used as a single crystal magnetic garnet film 14, for example. Thereupon, a single crystal magnetic garnet film 14 having a Pb content of about 5 ppm or less by weight is used.

A molten liquid of raw materials with a single crystal film forming component melted in a solvent component containing substantially Pb-free compounds is prepared for forming such a single crystal magnetic garnet film 14. The single crystal magnetic garnet film 14 having substantially no Pb, that is, a Pb content of about 5 ppm or less by weight, is formed on a non-magnetic substrate 12 by preparing the molten liquid of raw materials in a supersaturated state, and bringing it into contact with the non-magnetic substrate 12 which is rotating. As a solvent having Pb-free compound, a solvent having a molybdenum oxide as the main component can be used, for example.

As a molybdenum oxide, $MoO_2$ as well as $MoO_3$ can be used. It is believed that this is because $MoO_2$ is converted into $MoO_3$ in the course of melting the molten liquid of raw materials at a high temperature. Also, the above-described solvent preferably contains an alkali metal oxide such as lithium oxide, potassium oxide or the like in addition to a molybdenum oxide. These alkali metal oxides have the effect of suppressing the evaporation of the molybdenum oxide and the effect of decreasing the viscosity of the molten liquid of raw materials. It is further preferable to mix a molybdenum oxide and an alkali metal oxide at a ratio of about 50–90 mol % of the former to about 10–50 mol % of the latter. This is because the mirror surface property of the obtained single crystal magnetic garnet film is enhanced. It is noted that when the content of a molybdenum oxide is less than about 50 mol % and the content of an alkali metal oxide exceeds about 50 mol %, the melting point of the molten liquid of raw materials is raised, and stable liquid phase epitaxial growth of a single crystal magnetic garnet film tends to be more difficult. On the other hand, when the content of a molybdenum oxide exceeds about 90 mol % and the content of an alkali metal oxide is less than about 10 mol %, the amount of evaporated molybdenum oxide is increased during the crystal growth, tending to make the crystal growth less reproducible. The above-described solvent may further include bismuth oxide, barium oxide, boron oxide, etc. It is, however, preferable not to contain barium oxide, since barium in the barium oxide comes into the single crystal magnetic garnet film during the liquid phase epitaxial growth of the film, thus affecting the magnetostatic properties. Regarding bismuth oxide, too high an amount of the oxide makes it difficult to form a single crystal film with a mirror surface.

However, it can be used as a trace additive. Boron oxide can also be used as a trace additive.

Figure 3:
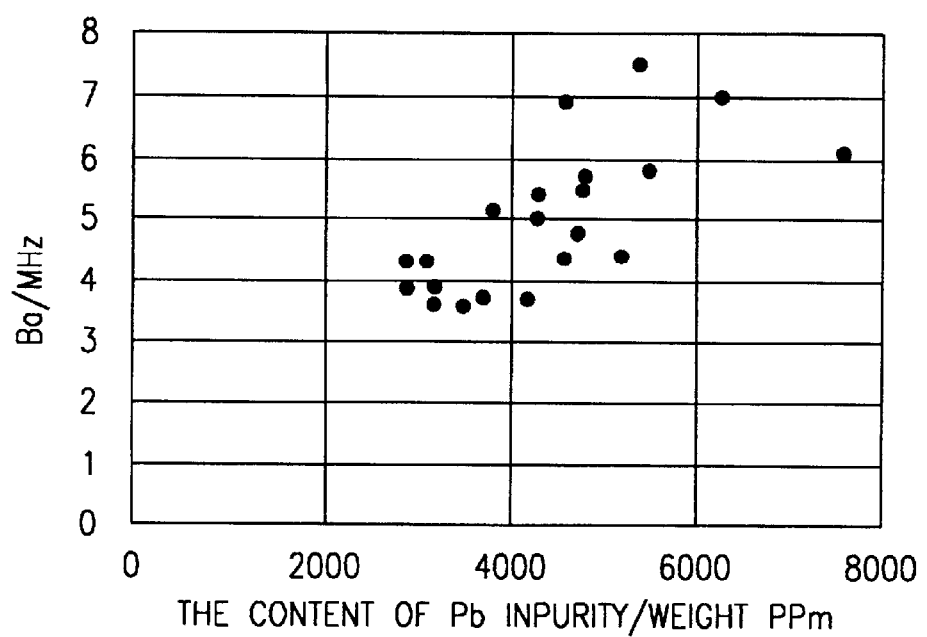
FIG. 3 is a graph showing the relationship between the content of Pb impurities contained in a single crystal magnetic garnet film and the bandwidth range Ba of the magnetostatic wave element shown in FIG. 1.

A magnetostatic wave element 10 thus obtained has a single crystal magnetic garnet film 14 with no Pb detected by inductively coupled plasma emission spectroscopy, thus making it possible to have a narrower bandwidth range Ba in which the electric power of the output signal is suppressed centering around frequency $f_o$ by 3 dB or more as shown in FIG. 3. Accordingly, a magnetostatic wave element 10 with good frequency properties can be obtained.

EXAMPLE 1

First, $MoO_3$ and $Li_2O$ as solvent components and $Fe_2O_3$ and $Y_2O_3$ as YIG components for forming a single crystal magnetic garnet film were compounded at a molar ratio of MoO$_3$: Li$_2$O: Y$_2$O$_3$: Fe$_2$O$_3$=39.1: 37.5: 16.9: 6.5. The mixture thus blended was charged into a Pt crucible as a molten liquid of raw materials. The molten liquid of raw materials was melted for 12 hours at 1,200° C., was cooled to 1,100° C., and was made to contact a GGG substrate with a diameter of 52 mm for 2 hours to form a single crystal YIG film with a film thickness of about 5 μm on the GGG substrate. The composition of the single crystal YIG film was analyzed by inductively coupled plasma emission spectroscopy. As a result, Mo, Li, and Pt were detected as the components other than Fe$_2$O$_3$ and Y$_2$O$_3$ which were the single crystal component, as shown in Table 1. However, the contents thereof were all extremely low and were not more than 40 ppm by weight. It was only natural that Pb was not detected from the single crystal film.

TABLE 1

| Impurity elements | Content of impurities (weight ppm) |
| --- | --- |
| Mo | 36 |
| Li | 22 |
| Pt | 16 |

Two microstrip lines were formed approximately in parallel with each other with a specific distance therebetween on a single crystal YIG film prepared in this way, and a magnetostatic wave element was manufactured as shown in FIG. 1. The Ba was 1.4 MHZ in a measurement in which frequency f$_o$ of the input signal was set to 1.5 GHz, the input electric power Pin was set to −17 dBm and the applied magnetic field H was set to 8,000 A/m. The value Ba=1.4 MHZ obtained from this magnetostatic wave element was extremely good, since the value was, as is understood from the comparison with that in FIG. 3, only ⅕ to ½ of that obtained using a single crystal YIG film containing Pb, the film having been manufactured using a molten liquid of raw materials of a PbO—B$_2$O$_3$ system.

EXAMPLE 2

MoO$_3$ and K$_2$O as solvent components and Fe$_2$O$_3$ and Y$_2$O$_3$ as YIG components were compounded at a molar ratio of MoO$_3$: K$_2$O: Y$_2$O$_3$: Fe$_2$O$_3$=39.1: 37.5: 16.9 : 6.5. The mixture thus blended was charged into a Pt crucible as a molten liquid of raw materials. The molten liquid of raw materials was melted for 12 hours at 1,200° C., was cooled to 1,100° C., and was made to contact a GGG substrate with a diameter of 52 mm for 2 hours to form on single crystal YIG film with a film thickness of about 5 μm on the GGG substrate. The composition of the single crystal YIG film was analyzed by inductively coupled plasma emission spectroscopy. As a result, Mo, K, and Pt were detected as the components other than Fe$_2$O$_3$ and Y$_2$O$_3$ which were the single crystal components, as shown in Table 2. However, the contents thereof were all extremely low and were not more than 40 ppm by weight. It was only natural that Pb was not detected from the single crystal film.

TABLE 2

| Impurity elements | Content of impurities (weight ppm) |
| --- | --- |
| Mo | 40 |
| K | 33 |
| Pt | 23 |

Two microstrip lines were formed approximately in parallel with each other with a specific distance therebetween on a single crystal YIG film prepared in this way, and a magnetostatic wave element was manufactured as shown in FIG. 1. The Ba was 1.6 MHZ in a measurement in which frequency f$_o$ of the input signal was set to 1.5 GHz, the input electric power Pin was set to −17 dBm and the applied magnetic field H was set to 8,000 A/m. The value Ba=1.6 MHZ obtained from this magnetostatic wave element was extremely good, since the value was, as is understood from the comparison with that in FIG. 3, only ⅕ to ½ of that obtained using a single crystal YIG film containing Pb, the film having been manufactured using a molten liquid of raw materials of a PbO—B$_2$O$_3$ system.

Thus, it has been confirmed that a magnetostatic wave element having good frequency properties is obtained, when no Pb component is detected in a single crystal magnetic garnet film by inductively coupled plasma emission spectroscopy, in other words, when the content of Pb was about 5 ppm or less by weight, or was below the limit of detection by inductively coupled plasma emission spectroscopy.

What is claimed is:

1. A magnetostatic wave element comprising a single crystal magnetic garnet film, wherein said film contains about 5 ppm or less by weight of Pb.

2. A magnetostatic wave element according to claim 1, wherein said single crystal magnetic garnet film contains Mo.

3. A magnetostatic wave element according to claim 2, wherein said single crystal magnetic garnet film does not contain Ba.

4. A magnetostatic wave element according to claim 3, wherein said single crystal magnetic garnet film comprises an yttrium-iron-garnet single crystal film.

5. A magnetostatic wave element according to claim 4, further comprising two separated microstrip lines disposed on said single crystal magnetic garnet film approximately in parallel with each other.

6. A magnetostatic wave element according to claim 1, wherein said single crystal magnetic garnet film does not contain Ba.

7. A magnetostatic wave element according to claim 1, wherein said single crystal magnetic garnet film comprises an yttrium-iron-garnet single crystal film.

8. A magnetostatic wave element according to claim 1, further comprising two separated microstrip lines disposed on said single crystal magnetic garnet film approximately in parallel with each other.

9. A method for manufacturing a magnetostatic wave element having a single crystal magnetic garnet film comprising the steps of:

providing a raw material solution comprising a substantially Pb-free solvent comprising molybdenum oxide and a single magnetic garnet crystal film forming component; and bringing this raw material solution into contact with a substrate so as to grow a single crystal magnetic garnet film with a Pb content of about 5 ppm or less by weight on said substrate.

10. A method for manufacturing a magnetostatic wave element according to claim 9, wherein said molybdenum oxide comprises MoO$_3$.

11. A method for manufacturing a magnetostatic wave element according to claim 10, wherein said solvent further comprises an alkali metal oxide.

12. A method for manufacturing a magnetostatic wave element according to claim 11, wherein said solvent comprises about 50–90 mol % of said molybdenum oxide and about 10–50 mol % of said alkali metal oxide.

13. A method for manufacturing a magnetostatic wave element according to claim 12, wherein said single crystal film forming component comprises an yttrium-iron-garnet component.

14. A method for manufacturing a magnetostatic wave element according to claim 13, wherein said substrate comprises a non-magnetic substrate.

15. A method for manufacturing a magnetostatic wave element according to claim 14, wherein said non-magnetic substrate comprises a gadolinium-gallium-garnet substrate.

16. A method for manufacturing a magnetostatic wave element according to claim 15, further comprising forming a pair of approximately parallel, spaced microstrip lines on said single crystal magnetic garnet film.

17. A method for manufacturing a magnetostatic wave element according to claim 9, wherein said solvent further comprises an alkali metal oxide.

18. A method for manufacturing a magnetostatic wave element according to claim 9, wherein said single crystal film forming component comprises an yttrium-iron-garnet component.

19. A method for manufacturing a magnetostatic wave element according to claim 9, wherein said substrate comprises a non-magnetic substrate.

20. A method for manufacturing a magnetostatic wave element according to claim 9, further comprising forming a pair of approximately parallel, spaced microstrip lines on said single crystal magnetic garnet film.

21. A method for manufacturing a magnetostatic wave element according to claim 9, wherein the single crystal is grown by the liquid phase epitaxial method.

22. A magnetostatic wave element according to claim 1, wherein said single crystal magnetic garnet film is a liquid phase epitaxial single crystal magnetic garnet film.

* * * * *